United States Patent [19]

Whitaker

[11] Patent Number: 4,622,648

[45] Date of Patent: Nov. 11, 1986

[54] COMBINATIONAL LOGIC STRUCTURE USING PASS TRANSISTORS

[75] Inventor: Sterling R. Whitaker, Chubbuck, Id.

[73] Assignee: American Microsystems, Inc., Santa Clara, Calif.

[21] Appl. No.: 732,125

[22] Filed: May 8, 1985

Related U.S. Application Data

[62] Division of Ser. No. 376,895, May 10, 1982, Pat. No. 4,541,067.

[51] Int. Cl.$^4$ .......................... G06F 7/50; H03K 23/56
[52] U.S. Cl. .................................... 364/715; 364/784; 377/123
[58] Field of Search .................. 364/715, 784; 377/123

[56] References Cited

U.S. PATENT DOCUMENTS

| | | | |
|---|---|---|---|
| 3,986,042 | 10/1976 | Padgett et al. | 307/471 |
| 4,064,421 | 12/1977 | Gajski et al. | 364/715 |
| 4,071,905 | 1/1978 | Oguchi et al. | 364/784 |
| 4,233,524 | 11/1980 | Burdick | 307/471 |
| 4,322,644 | 3/1982 | Bott et al. | 377/123 |
| 4,367,420 | 1/1983 | Foss et al. | 307/471 |
| 4,383,304 | 5/1983 | Hirashima | 364/715 |
| 4,417,161 | 11/1983 | Uya | 307/471 |
| 4,424,460 | 1/1984 | Best | 307/471 |
| 4,471,454 | 9/1984 | Dearden et al. | 364/784 |

OTHER PUBLICATIONS

Mead et al, *Introduction to VLSI Systems* Addison-Wesley, Oct. 1980, pp. 157-162.

*Primary Examiner*—David H. Malzahn
*Attorney, Agent, or Firm*—Walter J. Madden; Alan H. MacPherson; Steven F. Caserza

[57] ABSTRACT

PASS transistors are used to reduce the layout complexity of logic circuits by using PASS transistors connected to pass a first and second input function to an output node in response to selected control signals, thereby to generate a selected output function on the output node. The PASS transistor comprises a transistor capable of passing an input function in response to a control signal applied to the transistor thereby to generate an output function related to the input function. In general, the input function comprises less than all of a set of input variables and the control function comprises one or more of the remainder of the set of input variables.

5 Claims, 73 Drawing Figures

FIG. 1a
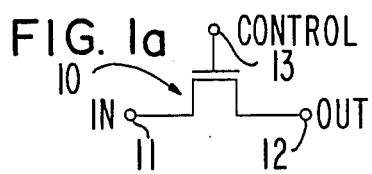
FIG. 1b
| CONTROL | OUT |
|---|---|
| 0 | — |
| 1 | IN |
FIG. 2a
| A B | Z |
|---|---|
| 0 0 | 1 |
| 0 1 | 0 |
| 1 0 | 0 |
| 1 1 | 1 |
FIG. 2b
| B\A | 0 | 1 |
|---|---|---|
| 0 | ① | |
| 1 | | ① |
FIG. 2c
$Z = \bar{A}\bar{B} + AB$
FIG. 2d
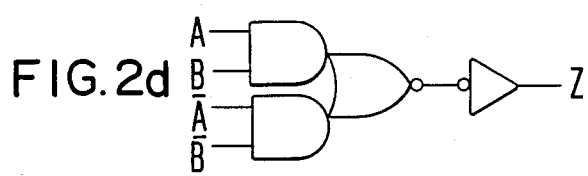
FIG. 3a
| A B | Z | PASS |
|---|---|---|
| 0 0 | 1 | $\bar{A} + \bar{B}$ |
| 0 1 | 0 | $A + \bar{B}$ |
| 1 0 | 0 | $\bar{A} + B$ |
| 1 1 | 1 | $A + B$ |
FIG. 3b
| B\A | 0 | 1 |
|---|---|---|
| 0 | $\bar{A}\ \bar{B}$ | $\bar{A}\ B$ |
| 1 | $A\ \bar{B}$ | $A\ B$ |
FIG. 3c
| B\A | 0 | 1 |
|---|---|---|
| 0 | $\bar{A}$ | $\bar{A}$ |
| 1 | $A\ \bar{B}$ | $A\ B$ |
FIG. 3d
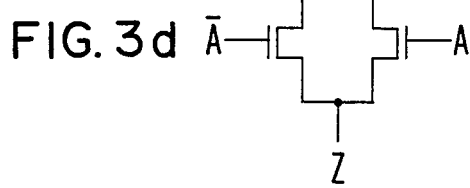
FIG. 4a
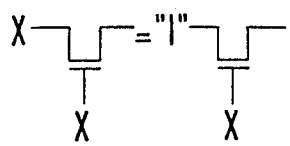
FIG. 4b
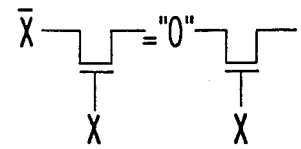

FIG. 5

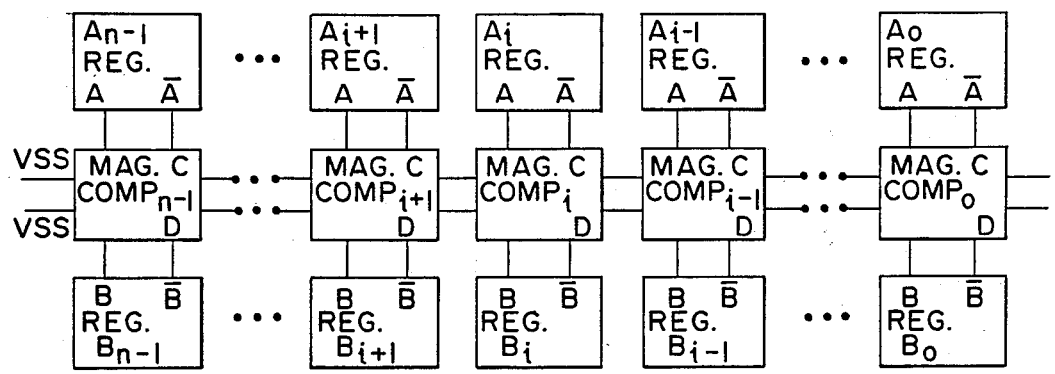

FIG. 6

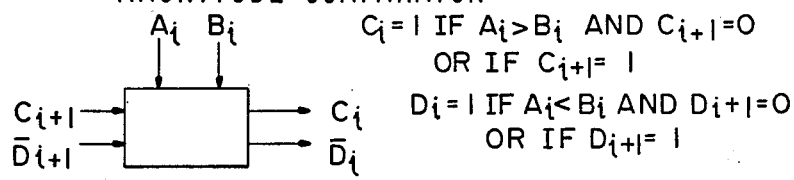

MAGNITUDE COMPARATOR $C_i = 1$ IF $A_i > B_i$ AND $C_{i+1} = 0$
OR IF $C_{i+1} = 1$ $D_i = 1$ IF $A_i < B_i$ AND $D_{i+1} = 0$
OR IF $D_{i+1} = 1$

| $A_i$ | $B_i$ | $C_{i+1}$ | $D_{i+1}$ | $C_i$ | $D_i$ | PASS $C_i$ | PASS $\bar{D}_i$ |
|---|---|---|---|---|---|---|---|
| 0 | 0 | 0 | 0 | 0 | 1 | $A+B+C+D$ | $\bar{A}+\bar{B}+\bar{C}+\bar{D}$ |
| 0 | 0 | 0 | 1 | 0 | 0 | $A+B+C+\bar{D}$ | $A+B+C+\bar{D}$ |
| 0 | 0 | 1 | 0 | 1 | 1 | $\bar{A}+\bar{B}+C+\bar{D}$ | $\bar{A}+\bar{B}+C+\bar{D}$ |
| 0 | 0 | 1 | 1 | — | — | — — — — | — — — — |
| 0 | 1 | 0 | 0 | 0 | 0 | $A+\bar{B}+C+D$ | $A+\bar{B}+C+D$ |
| 0 | 1 | 0 | 1 | 0 | 0 | $A+\bar{B}+C+\bar{D}$ | $A+\bar{B}+C+\bar{D}$ |
| 0 | 1 | 1 | 0 | 1 | 1 | $\bar{A}+B+C+\bar{D}$ | $\bar{A}+B+C+\bar{D}$ |
| 0 | 1 | 1 | 1 | — | — | — — — — | — — — — |
| 1 | 0 | 0 | 0 | 1 | 1 | $A+\bar{B}+\bar{C}+\bar{D}$ | $A+\bar{B}+\bar{C}+\bar{D}$ |
| 1 | 0 | 0 | 1 | 0 | 0 | $\bar{A}+B+C+\bar{D}$ | $\bar{A}+B+C+\bar{D}$ |
| 1 | 0 | 1 | 0 | 1 | 1 | $A+\bar{B}+C+\bar{D}$ | $A+\bar{B}+C+\bar{D}$ |
| 1 | 0 | 1 | 1 | — | — | — — — — | — — — — |
| 1 | 1 | 0 | 0 | 0 | 1 | $\bar{A}+\bar{B}+C+D$ | $A+B+\bar{C}+\bar{D}$ |
| 1 | 1 | 0 | 1 | 0 | 0 | $\bar{A}+\bar{B}+C+\bar{D}$ | $\bar{A}+\bar{B}+C+\bar{D}$ |
| 1 | 1 | 1 | 0 | 1 | 1 | $A+B+C+\bar{D}$ | $A+B+C+\bar{D}$ |
| 1 | 1 | 1 | 1 | — | — | — — — — | — — — — |

FIG. 7

FIG. 8a
FIG. 8b
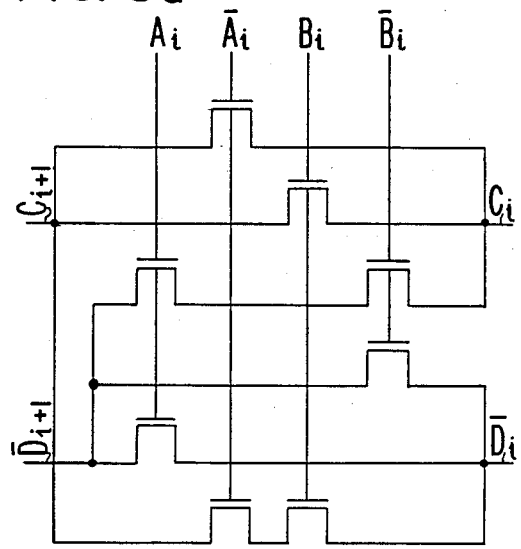
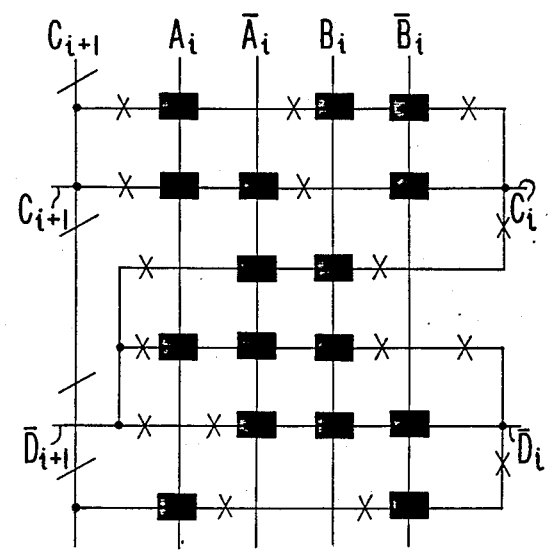
AND
| A | B | C | PASS |
|---|---|---|------|
| 0 | 0 | 0 | $A+B$ |
| 0 | 1 | 0 | $A+\bar{B}$ |
| 1 | 0 | 0 | $\bar{A}+B$ |
| 1 | 1 | 1 | $A+B$ |
FIG. 9a
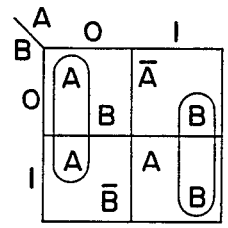
FIG. 9b
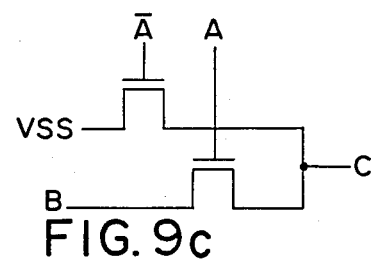
FIG. 9c
NAND
| A | B | C | PASS |
|---|---|---|------|
| 0 | 0 | 1 | $\bar{A}+\bar{B}$ |
| 0 | 1 | 1 | $\bar{A}+B$ |
| 1 | 0 | 1 | $A+\bar{B}$ |
| 1 | 1 | 0 | $\bar{A}+\bar{B}$ |
FIG. 10a
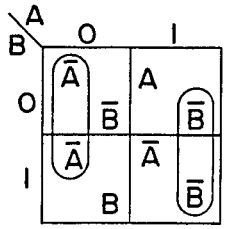
FIG. 10b
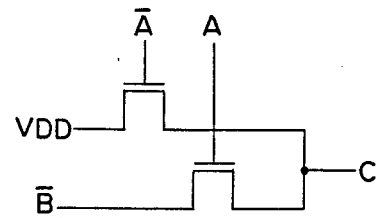
FIG. 10c
OR
| A | B | C | PASS |
|---|---|---|------|
| 0 | 0 | 0 | $A+B$ |
| 0 | 1 | 1 | $\bar{A}+B$ |
| 1 | 0 | 1 | $A+\bar{B}$ |
| 1 | 1 | 1 | $A+B$ |
FIG. 11a
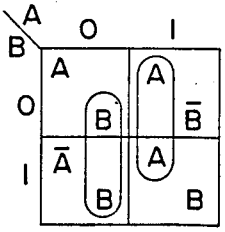
FIG. 11b
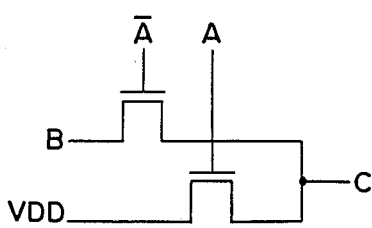
FIG. 11c

FIG. 12a
NOR
| A B | C | PASS |
|---|---|---|
| 0 0 | 1 | $\bar{A}+\bar{B}$ |
| 0 1 | 0 | $A+\bar{B}$ |
| 1 0 | 0 | $\bar{A}+B$ |
| 1 1 | 0 | $\bar{A}+\bar{B}$ |
FIG. 12b
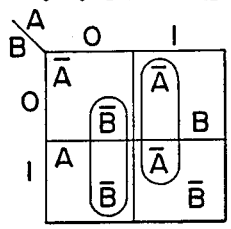
FIG. 12c
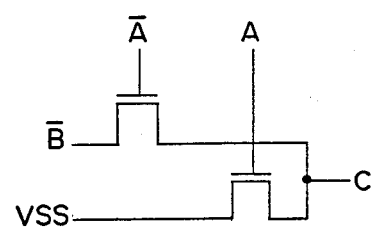
FIG. 13a
EX OR
| A B | C | PASS |
|---|---|---|
| 0 0 | 0 | $A+B$ |
| 0 1 | 1 | $\bar{A}+B$ |
| 1 0 | 1 | $A+\bar{B}$ |
| 1 1 | 0 | $\bar{A}+\bar{B}$ |
FIG. 13b
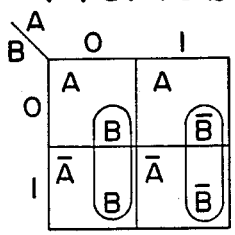
FIG. 13c
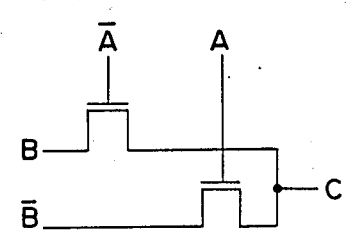
FIG. 14a
EX NOR
| A B | C | PASS |
|---|---|---|
| 0 0 | 1 | $\bar{A}+\bar{B}$ |
| 0 1 | 0 | $A+\bar{B}$ |
| 1 0 | 0 | $\bar{A}+B$ |
| 1 1 | 1 | $A+B$ |
FIG. 14b
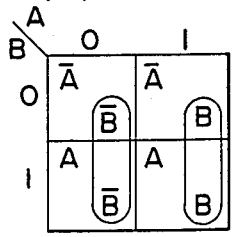
FIG. 14c
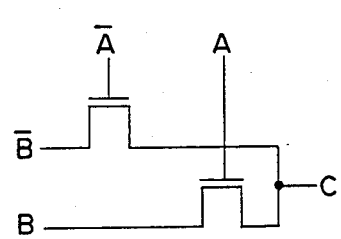
FIG. 15a
FULL ADDER
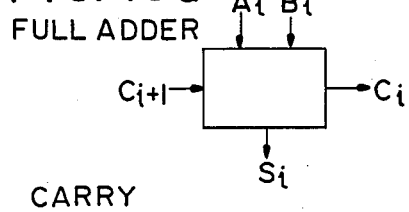
CARRY
| $A_i B_i C_{i+1}$ | $C_i$ | PASS |
|---|---|---|
| 0 0 0 | 0 | $A+B+C$ |
| 0 0 1 | 0 | $A+B+\bar{C}$ |
| 0 1 0 | 0 | $A+\bar{B}+C$ |
| 0 1 1 | 1 | $\bar{A}+B+C$ |
| 1 0 0 | 0 | $\bar{A}+B+C$ |
| 1 0 1 | 1 | $A+\bar{B}+C$ |
| 1 1 0 | 1 | $A+B+\bar{C}$ |
| 1 1 1 | 1 | $A+B+C$ |
FIG. 15b
FIG. 15c
FIG. 15d
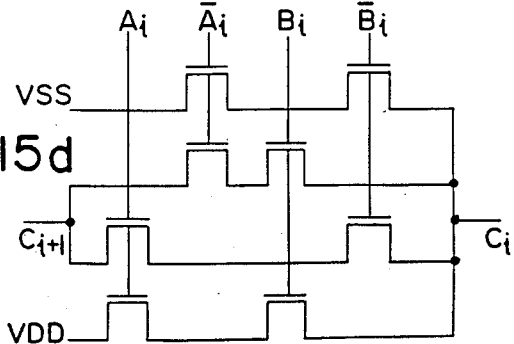

FIG. 16a
| $A_i$ $B_i$ $C_{i+1}$ | $S_i$ | PASS |
|---|---|---|
| 0 0 0 | 0 | $A+B+C$ |
| 0 0 1 | 1 | $\bar{A}+\bar{B}+C$ |
| 0 1 0 | 1 | $\bar{A}+B+\bar{C}$ |
| 0 1 1 | 0 | $A+\bar{B}+\bar{C}$ |
| 1 0 0 | 1 | $A+\bar{B}+\bar{C}$ |
| 1 0 1 | 0 | $\bar{A}+B+\bar{C}$ |
| 1 1 0 | 0 | $\bar{A}+\bar{B}+C$ |
| 1 1 1 | 1 | $A+B+C$ |
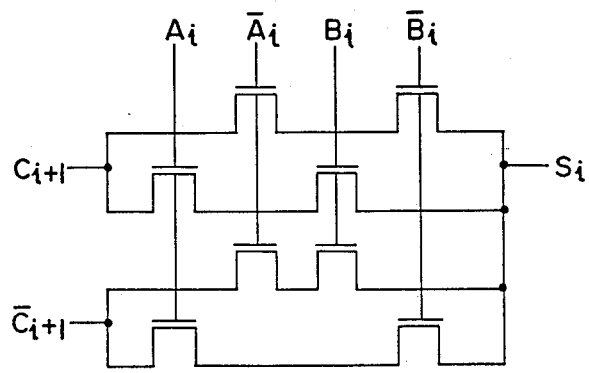
FIG. 16b
FIG. 16c
FIG. 16e
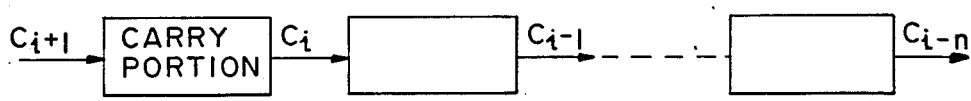
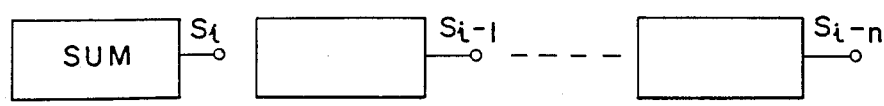
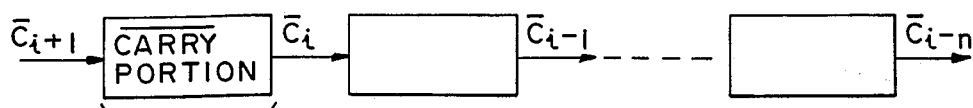
FIG. 16d

FIG. 16f LAYOUT

FIG. 17a   PRIORITY ENCODER   IF A=1          DE=10
                              IF A=0, B=1     DE=01
                              IF A=0, B=0, C=1 DE=00
                              IF A=0, B=0, C=0 DE=11

| A | B | C | D | E | PASS D | PASS E |
|---|---|---|---|---|--------|--------|
| 0 | 0 | 0 | 1 | 1 | $\bar{A}+\bar{B}+\bar{C}$ | $\bar{A}+\bar{B}+\bar{C}$ |
| 0 | 0 | 1 | 0 | 0 | $A+\bar{B}+\bar{C}$ | $A+B+\bar{C}$ |
| 0 | 1 | 0 | 0 | 1 | $A+\bar{B}+C$ | $\bar{A}+B+\bar{C}$ |
| 0 | 1 | 1 | 0 | 1 | $A+\bar{B}+\bar{C}$ | $\bar{A}+B+C$ |
| 1 | 0 | 0 | 1 | 0 | $A+\bar{B}+\bar{C}$ | $\bar{A}+B+C$ |
| 1 | 0 | 1 | 1 | 0 | $A+\bar{B}+C$ | $\bar{A}+B+\bar{C}$ |
| 1 | 1 | 0 | 1 | 0 | $A+B+\bar{C}$ | $\bar{A}+\bar{B}+C$ |
| 1 | 1 | 1 | 1 | 0 | $A+B+C$ | $\bar{A}+\bar{B}+\bar{C}$ |

FIG. 17e
PASS VARIABLE TO CONTROL VARIABLE TRANSFORMATION
FIG. 17f
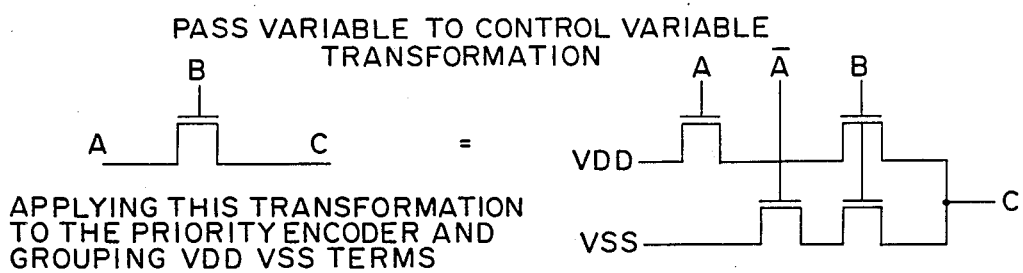
APPLYING THIS TRANSFORMATION TO THE PRIORITY ENCODER AND GROUPING VDD VSS TERMS
FIG. 17g
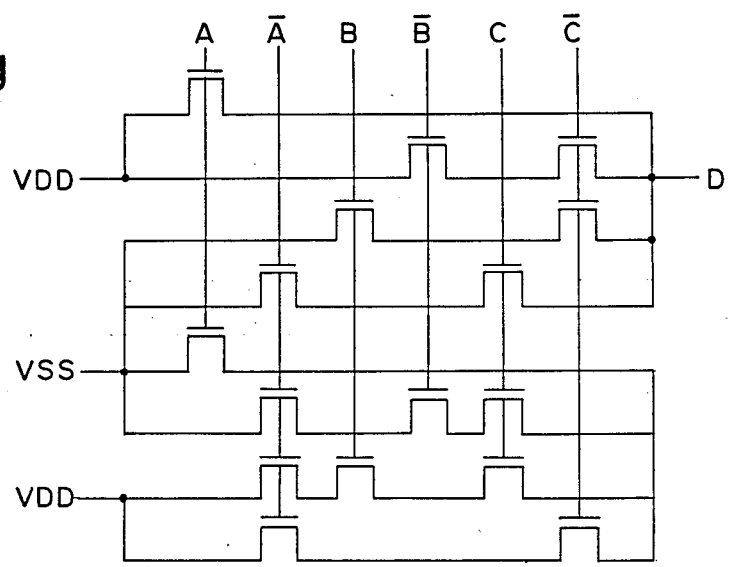
FIG. 17h
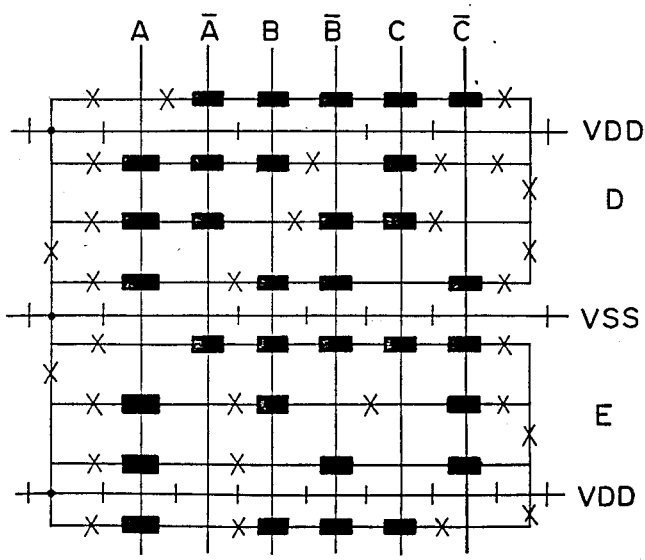

FIG. 18a  BINARY UP/DOWN COUNTER
D = 0  UP COUNT
D = 1  DOWN COUNT
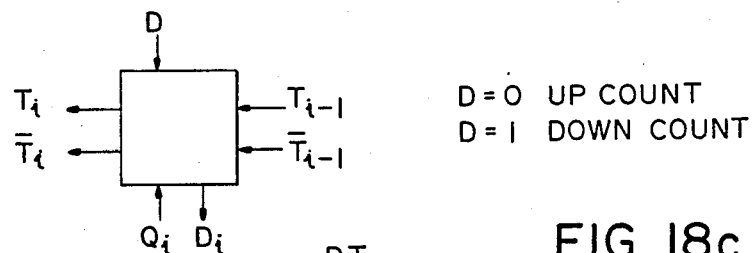
FIG. 18b
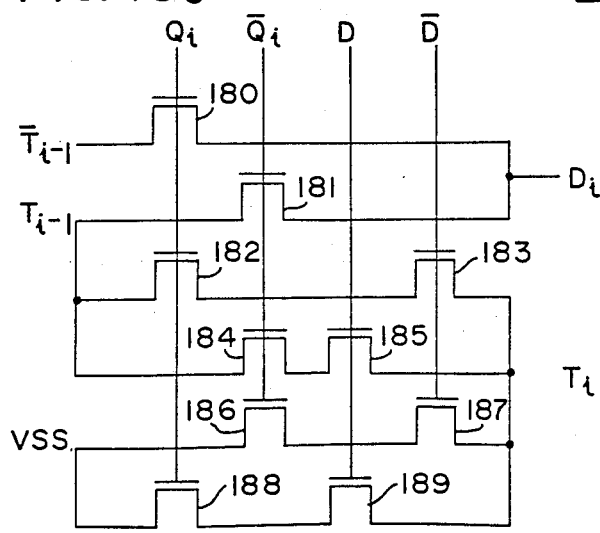
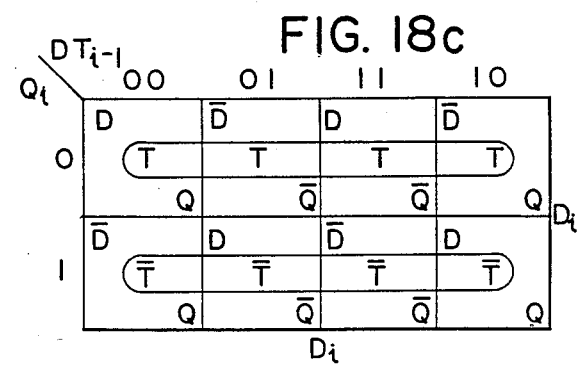
FIG. 18c
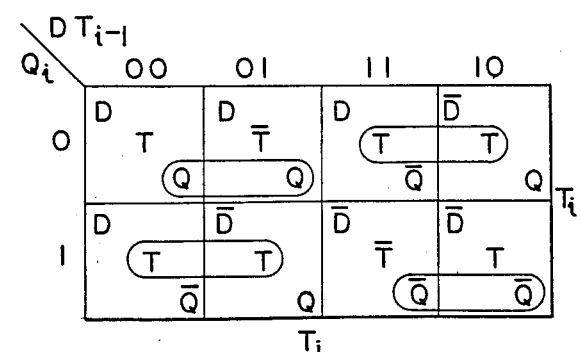
FIG. 18d
FIG. 18e THE PASS FUNCTION MAY BE ENTERED INTO THE
KARNAUGH MAP DIRECTLY SINCE IT IS ALWAYS
THE STATE VARIABLES OR THE INVERSE OF THE
STATE VARIABLES BINARY UP COUNTER
| $T_{i-1}$ | $Q_i$ | $D_i$ | $T_i$ |
|---|---|---|---|
| 0 | 0 | 0 | 0 |
| 0 | 1 | 1 | 0 |
| 1 | 0 | 1 | 0 |
| 1 | 1 | 0 | 1 |
FIG. 19b
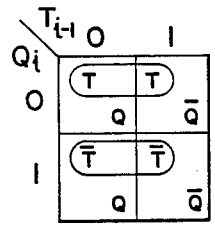
FIG. 19c
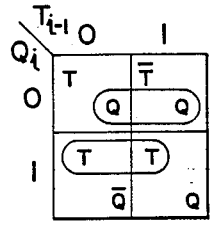
FIG. 19d
FIG. 19e
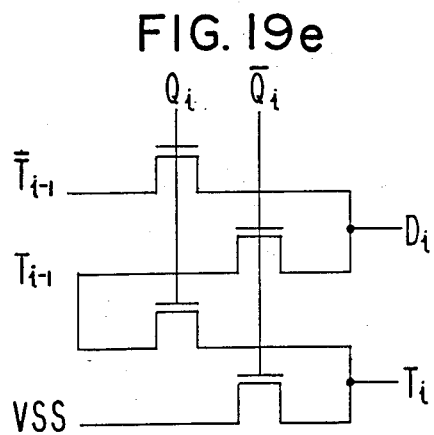
FIG. 19f
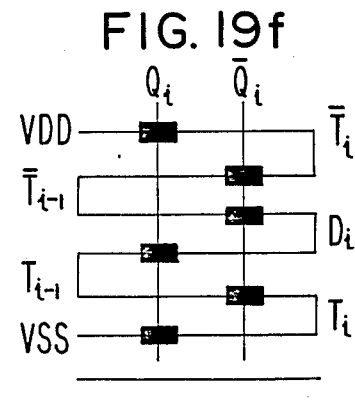

FIG. 20a
JK FLIP FLOP
| J | K | Q | D |
|---|---|---|---|
| 0 | 0 | 0 | 0 |
| 0 | 0 | 1 | 1 |
| 0 | 1 | 0 | 0 |
| 0 | 1 | 1 | 0 |
| 1 | 0 | 0 | 1 |
| 1 | 0 | 1 | 1 |
| 1 | 1 | 0 | 1 |
| 1 | 1 | 1 | 0 |
FIG. 20b
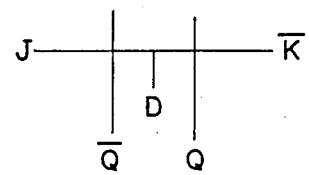
FIG. 20c
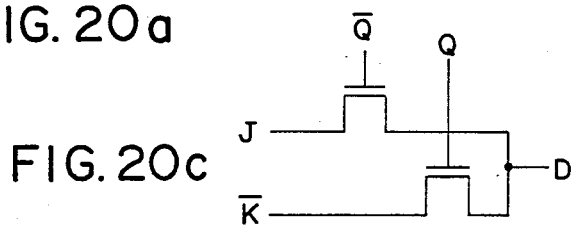
FIG. 20d
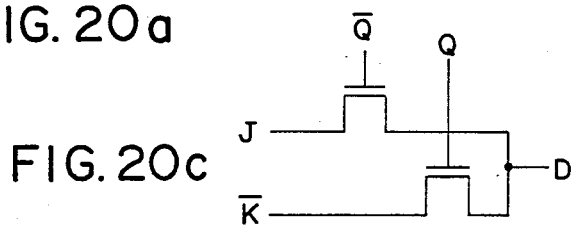
FIG. 21a
SHIFT LEFT/HOLD
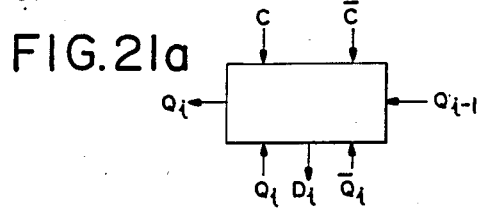
FIG. 21b
| C | $Q_{i-1}$ | $Q_i$ | $D_i$ |
|---|---|---|---|
| 0 | 0 | 0 | 0 |
| 0 | 0 | 1 | 1 |
| 0 | 1 | 0 | 0 |
| 0 | 1 | 1 | 1 |
| 1 | 0 | 0 | 0 |
| 1 | 0 | 1 | 0 |
| 1 | 1 | 0 | 1 |
| 1 | 1 | 1 | 1 |
FIG. 21c
C = 1 SHIFT LEFT
C = 0 HOLD
FIG. 21d
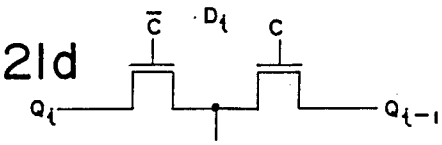
FIG. 21e
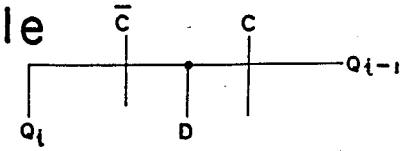

COMBINATIONAL LOGIC STRUCTURE USING PASS TRANSISTORS

CROSS REFERENCE TO RELATED APPLICATION

This application is a division of copending application Ser. No. 06/376,895, filed May 10, 1982, now U.S. Pat. No. 4,541,067 and assigned to the same assignee as the present application.

BACKGROUND OF THE INVENTION

1. Field of the Invention

This invention relates to logic circuits and in particular to a logical element known as a PASS transistor and to logic circuits formed using PASS transistors so as to substantially reduce the number of active devices required to implement logic functions.

2. Prior Art

Boolean logic expressions may be realized through classical logic design methods with networks of combinational logic. Logic networks using MOS technology are often formed with NAND, NOR and Inversion gates since these structures are easily implemented. The PASS transistor is another common MOS structure. Classical logic design methods, however, do not result in networks of PASS transistors.

FIG. 1a shows the PASS transistor with its logical function. When the gate or control electrode 13 to PASS transistor 10 is asserted (and by "asserted" is meant driven to a voltage so as to form a conductive path between input lead 11 and output lead 12), transistor 10 passes the logic state at input lead 11 to output lead 12. The input and output leads of an MOS transistor may be arbitrarily chosen because an MOS transistor is bidirectional. For convenience, the input lead shall hereafter be defined as the terminal driven by the source of a logic state. The output lead 12 of PASS transistor 10 typically applies the passed logic state to the input lead of another series connected logic structure. Output leads of a number of PASS transistors may be joined to drive the same input of a logic structure provided that all PASS transistors whose controls are asserted are passing the same logic state. The use of PASS transistors as bidirectional transmission gates is described in an article entitled "VLSI: A New Frontier for Systems Designers" published in the January 1982 *Computer Journal of the IEEE* by Douglas G. Fairbairn, which is hereby incorporated by reference.

SUMMARY

In accordance with this invention, logic networks are fabricated using PASS transistors so as to maximize the regularity of the resulting logic circuitry. The resulting logical networks give significant topological, power and speed advantages over prior art logic circuits when used to form combinational logic.

The use of the PASS transistor as a logic element yields several advantages over the NAND, NOR and inverter structures used in prior art logic circuits such as MOS-integrated logic circuits. First, the PASS transistor dissipates no significant steady state power. Second, arrays of PASS transistors form structures of regular topology often consuming less area for a given logical function than consumed by NAND, NOR and inverter arrays. Third, combinational logic formed with PASS transistors often reduces the signal propagation delay through a network.

While the major disadvantage of the PASS transistor is that the voltage level of the logic high signal on its output lead is degraded due to the characteristics of the field effect transistor used as the PASS transistor, this can be overcome by careful circuit design. However, after passing a logic high level through one PASS transistor, no significant further degradation of voltage level occurs when the signal is passed through N additional PASS transistors assuming no PASS transistor control input is driven by the output of another PASS transistor.

BRIEF DESCRIPTION OF THE DRAWINGS

FIGS. 1a and 1b illustrate a PASS transistor and the truth table for that transistor;

FIGS. 2a through 2d illustrate the logical function $Z = \overline{A}B + AB$ implemented using AND gates, a NOR gate and an inverter, and the truth table, Karnaugh plot and Boolean equation associated with that structure;

FIGS. 3a through 3d illustrate the truth table, the Karnaugh map, the looping of the PASS functions for an equivalence gate and the resulting PASS transistor network, respectively, for the same logical function shown in FIG. 2c;

FIGS. 4a and 4b illustrate two functional identities which are employed to make logic networks using PASS transistors;

FIG. 5 illustrates in schematic block diagram form a magnitude comparator structure of well known design;

FIG. 6 illustrates the truth table for the magnitude comparator shown in FIG. 5;

FIG. 7 illustrates the Karnaugh map and the looping of the PASS functions necessary to produce the logical functions required by the truth table of FIG. 6;

FIGS. 8a and 8b illustrate the PASS transistor implementation of the logic circuit necessary to implement the truth table of FIG. 6 and the silicon layout (in accordance with the conventions shown in FIGS. 16d and 16f) of the transistors shown in FIG. 8a, respectively;

FIGS. 9a, 9b and 9c illustrate, respectively, the truth table, Karnaugh map with PASS variables looped and circuit diagram of the resulting logical network for an AND gate;

FIGS. 10a, 10b and 10c illustrate, respectively, the truth table, Karnaugh map with PASS functions looped and the logic circuit implemented using PASS transistors for a NAND gate;

FIGS. 11a, 11b and 11c illustrate, respectively, the truth table, Karnaugh map with PASS functions looped and the logic circuit implemented using PASS transistors for an OR gate;

FIGS. 12a, 12b and 12c illustrate, respectively, the truth table, Karnaugh map with PASS functions looped and the logic circuit implemented using PASS transistors for a NOR gate;

FIGS. 13a, 13b and 13c illustrate, respectively, the truth table, Karnaugh map with PASS functions looped and the logic circuit implemented using PASS transistors for an Exclusive OR gate;

FIGS. 14a, 14b and 14c illustrate, respectively, the truth table, Karnaugh map with PASS functions looped and the logic circuit implemented using PASS transistors for an Exclusive NOR gate;

FIGS. 15a, 15b, 15c and 15d illustrate, respectively, the block diagram, the truth table, the Karnaugh map with PASS functions looped and the logic circuit implementation using PASS transistors, respectively, for the carry generator of a full adder;

FIGS. 16a, 16b and 16c illustrate, respectively, the truth table, Karnaugh map with PASS functions looped and the logic circuit implemented using PASS transistors for a summing network of a full adder;

FIG. 16e illustrates the relationship of the structure of FIG. 16d to a complete adding circuit;

FIG. 16f illustrates the way in which an MOS transistor is illustrated in FIG. 16d;

FIGS. 17a, 17b, 17c and 17d (wherein the components of FIG. 17d are labelled in accordance with the conventions of FIGS. 16d and 16f) illustrate the truth table, the Karnaugh map with the PASS functions circled, the logic circuit implementation using PASS transistors, and the schematic top view of the semiconductor N channel MOS transistor implementation of the circuit of FIG. 17c, respectively;

FIGS. 17e and 17f illustrate the PASS variable to CONTROL variable transformations used in implementing the structure of FIG. 17c;

FIGS. 17g and 17h (wherein the components of FIG. 17h are labelled in accordance with the conventions of FIGS. 16d and 16f) illustrate the logic circuitry and the layout of this logic circuitry in N channel MOS technology after the transformations illustrated in FIGS. 17e and 17f have been applied to the circuit of FIG. 17c;

FIG. 18a illustrates a block diagram for a binary up/down counter;

FIGS. 18b, 18c, 18d and 18e illustrate, respectively, the truth table, the Karnaugh map with the input PASS functions looped and the circuit implementation of the Karnaugh map;

FIGS. 19b, 19c, 19d, 19e and 19f illustrate, respectively, the truth table, the Karnaugh map with PASS functions looped, the circuit implementation and the N channel MOS transistor implementation for the binary up counter of FIG. 19a;

FIGS. 20a, 20b, 20c and 20d illustrate, respectively, the truth table, the Karnaugh map with PASS functions looped, the circuit implementation and the N channel MOS transistor implementation for a JK flip-flop;

FIG. 21a illustrates in schematic block diagram form a shift left/hold circuit;

FIGS. 21b, 21c, 21d and 21e illustrate, respectively, the truth table, the Karnaugh map with PASS functions circled, the circuit implementation and the N channel MOS transistor implementation of the shift left/hold structure.

DETAILED DESCRIPTION

Figure 16D:
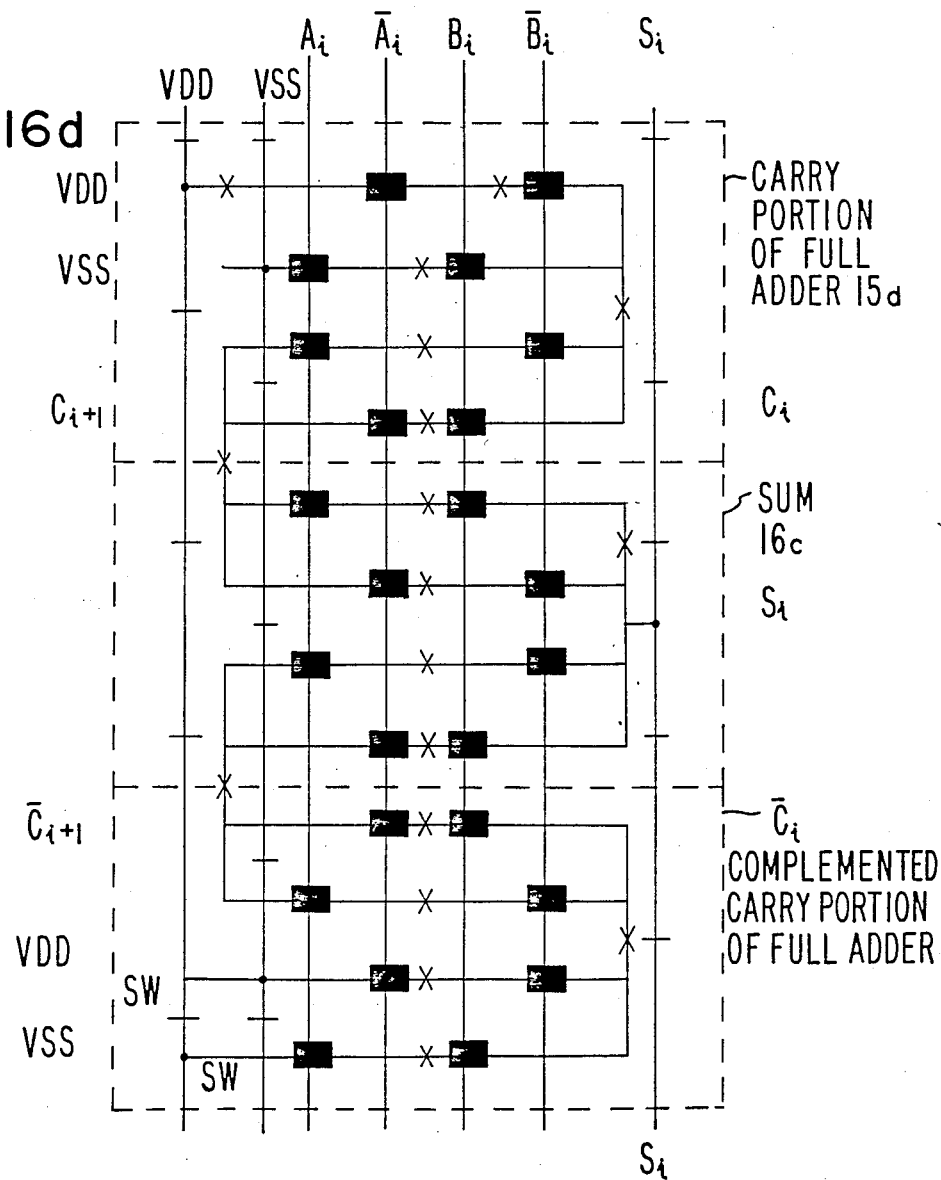
FIG. 16d illustrates the layout of the circuit shown in FIG. 16c for the full adder structure.

The classical design of combinational digital logic circuits may be illustrated by the following example. First a truth table for the desired logical function is formed. FIG. 2a shows the truth table for an Exclusive NOR or equivalence gate. When input A is equal in value to input B, the output assumes a logic one state. When input A is not equal in value to input B, the output assumes a logic zero state. The truth table information is then entered into a Karnaugh map. The output function is reduced and read from the Karnaugh map using looping techniques. A Karnaugh map reduction of the Exclusive NOR truth table is shown in FIG. 2b, with the Boolean expression shown in FIG. 2c. The function is then implemented using logic AND function and OR function gates. The implementation of this function with prior art logic structures requires two AND functions and one OR function. A possible MOS configuration has two nodes which dissipate power, two gate delays and consists of 7 transistors.

The technique for designing combinational logic which results in networks of PASS transistors will now be illustrated. The truth table in FIG. 3a shows that the output function $Z = \bar{A}\bar{B} + AB$ may be obtained by passing the input variables and/or their inversions. For example, in the first state of the truth table, input variables A and B are both low and the output variable Z is high. Thus Z may be formed by passing the inversion of A or the inversion of B (i.e. $\bar{A}$ or $\bar{B}$). In the second state A is low and B is high. Since Z is low, Z may be formed by passing A or the inverse of B (i.e. $A$ or $\bar{B}$). The PASS functions of the other two states are similarly obtained and shown in the truth table in FIG. 3a. These PASS functions are then entered into the appropriate states of a Karnaugh map as illustrated in FIG. 3b. Note that the PASS formations replace the output signals in a normal Karnaugh map. Identical passed variables are identified in adjacent states on the Karnaugh map and then looped together as shown in FIG. 3c to reduce the CONTROL functions. These loopings may use normal Karnaugh map reduction techniques with the following rules. First, a variable must be passed in every "care" state of the map, since the output signal from a PASS transistor is undefined when its control input is low. (A "care" state is an input state for which the output state must be defined and is often referred to simply as a "state".) Second, more than one variable may be passed in each state, since the PASS function guarantees that the passed variables are the same logic level in a given state. Third, once a "don't care" state has been included in a loop, the pass function is established for that state.

A possible mapping for the equivalence gate using PASS transistors is to pass the inverse of B when A is low and to pass B when A is high. This mapping is shown in FIG. 3c. $\bar{A}$ is the CONTROL function that passes the PASS function $\bar{B}$ and A is the CONTROL function that passes the PASS function B. The PASS transistor network obtained is shown in FIG. 3d.

The PASS transistor Exclusive NOR shown in FIG. 3d dissipates no significant steady state power, has one PASS transistor delay and consists of only two transistors. Thus a substantial power, speed and area savings over the classical logic design methods is realized.

The area advantage of one circuit configuration over another is not always obvious from the logic or schematic diagrams. Also a lower transistor count does not guarantee that less silicon area will be used to lay out a circuit since electrical interconnect area requirements are not represented by transistor count. Both transistor count and regularity must be considered when comparing two circuit configurations for area advantages. Network regularity is a concept described, for example, in Chapter 3.1 of "Introduction to VLSI Systems" by Carver Mead and Lynn Conway published by *Addison Wesley Publishers*, 1980.

Maximum topological regularity for an array of PASS transistors is established if the intersection of the set of control variables with the set of passed variables is the null set. This allows passed variables to flow in one direction while the control variables flow at right angles. (A "CONTROL" variable is the input variable which drives the control terminal of a PASS transistor.

A "PASS" variable is the input variable which drives the input terminal of a PASS transistor and which is passed to the output terminal when the PASS transistor is turned on.) Regularity may be maximized in the CONTROL function if the CONTROL functions can be looped such that they are functions of only the control variables. Regularity in the PASS function may be maximized by making the PASS function independent of the control variables. This independence may be established through the use of the following identities. A PASS transistor whose input is variable X and whose control is also X always passes a one. This is equivalent to a PASS transistor whose input is high and whose control is X as shown in FIG. 4a. Similarly, a PASS transistor whose input is $\overline{X}$ and whose control is X always passes a zero. This is equivalent to a PASS transistor whose input is low and which is controlled by X. FIGS. 4a and 4b summarize these equivalences.

The iterative combinational array is a class of combinational logic for which the area of one circuit configuration versus another may easily be compared. Area may be compared by drawing the layout of one element of the array.

A useful circuit illustrative of iterative combinational arrays is the digital magnitude comparator. The magnitude comparison of two digital words $A = A_{n-1}, A_{n-2} \ldots A_i \ldots A_o$ and $B = B_{n-1}, B_{n-2} \ldots B_1 \ldots B_o$ is accomplished by comparing the ith bits and the results of all more significant bit comparisons. A comparison must produce three pieces of information to be complete: $A>B$, $A=B$ and $A<B$, but any one may be derived from the other two. It may be shown that $A>B$ and $A<B$ are good choices to implement. FIG. 5 shows the configuration of the comparison where $C_i$ is high indicating that $A>B$ if either ($A_i>B_i$ and $D_{i+1}=0$) or if ($C_{i+1}=1$) and $D_i$ is high indicating $A>B$ if either ($D_{i+1}=1$) or ($A_i>B_i$ and $C_{i+1}=0$).

Figure 7:
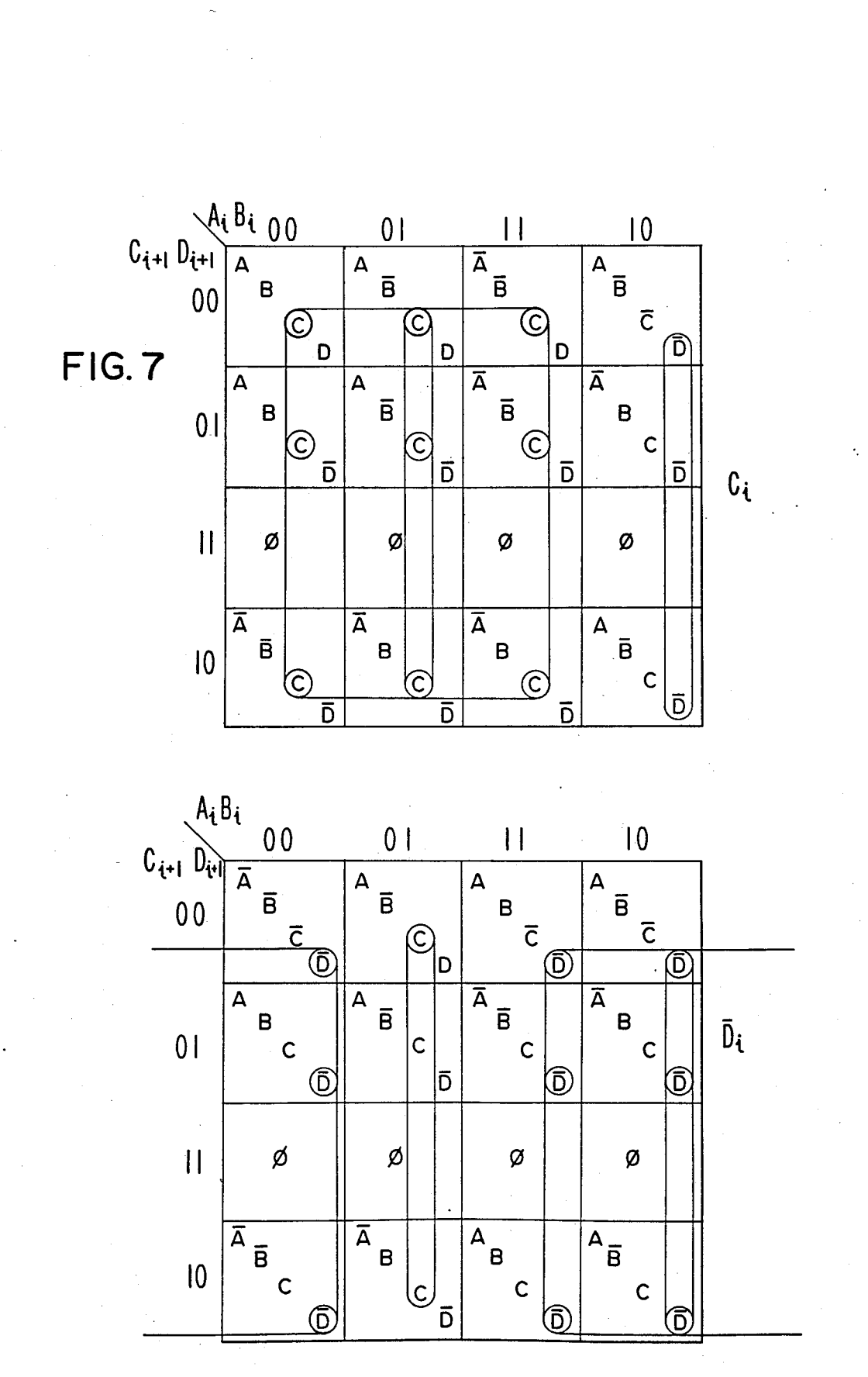

The first step in designing the magnitude comparator is to establish a truth table as illustrated in FIG. 6. The possible passed variables are then added to the truth table to define the PASS functions for each state and these passed variables are entered into a modified Karnaugh map. (In simple cases, where the identical pass variables associated with different states can be identified from the truth table, the modified Karnaugh map can be omitted.) Groups of passed variables are then ready to be looped (i.e. identified and circled for ease of reference). Since $C_{i+1}$ and $D_{i+1}$ influence directly $C_i$ and $D_i$, respectively, these are good choices for passed variables. If the Karnaugh map is looped as shown in FIG. 7, the CONTROL functions are functions of only variables $A_i$ and $B_i$ and the PASS functions $C_{i+1}$ and $D_{i+1}$ are independent of $A_i$ and $B_i$. The circuit schematic of the PASS transistor array is shown in FIG. 8a and the integrated circuit layout in N channel MOS technology is shown in FIG. 8b. In FIG. 8b, an MOS transistor is depicted by the crossing of two perpendicular lines and a conductive crossunder is depicted by a dark rectangle. The gate electrodes are the vertical lines labeled $A_i$, $\overline{A}_i$, $B_i$ and $\overline{B}_i$ and the horizontal lines labeled $C_{i+1}$ and $D_{i+1}$ comprise diffused conductive lines and source and drain regions.

The basic design method for constructing a logic circuit using the PASS transistor as the basic element is as follows:

1. Establish a truth table of the desired function.
2. Enter the PASS function into the truth table (the PASS function is an input variable or its inverse which is passed to the output lead of the PASS transistor to yield the desired output signal).
3. Enter the PASS function into a modified Karnaugh map wherein each state of the modified Karnaugh map contains the particular input variables (called the PASS function) which yield the desired output variable.
4. Loop (i.e. identify or group) the identical PASS variables in each PASS FUNCTION such that every care state (a care state is one combination of input variables where the output variable must be defined) has at least one PASS variable looped and such that the CONTROL function (i.e., the function that controls the gate of the PASS transistor) is independent of the PASS variables.
5. Use the identities shown in FIGS. 4a and 4b to make the PASS function independent of CONTROL variables.
6. Draw the PASS transistor network.

FIGS. 3a through 3d, discussed above, illustrate this procedure. As explained above, in some cases, step 3 can be omitted.

FIGS. 9a, 9b and 9c illustrate, respectively, this method for specifying the PASS transistor logic circuit representing an AND gate. As shown in FIG. 9c, a PASS transistor logic circuit is implemented using only two PASS transistors as compared to three to five transistors using the prior art implementation.

Note that in the logic circuit of FIG. 9c, the PASS function A is replaced with $V_{SS}$ (the circuit ground or reference voltage) in accordance with the identity of FIG. 4b.

FIGS. 10a, 10b and 10c illustrate, respectively, the truth table, Karnaugh plot and logic circuit implemented using PASS transistors for a NAND gate. Again, the inherent simplicity of the logic circuit utilizing PASS transistors in accordance with this invention is apparent.

Note that in the logic circuit of FIG. 10c, the PASS function $\overline{A}$ is replaced with $V_{DD}$ (the supply voltage) in accordance with the identity of FIG. 4a.

FIGS. 11a, 11b and 11c illustrate, respectively, the truth table, Karnaugh plot and logic network constructed using PASS transistors of an OR gate. In the logic circuit of FIG. 11c, the PASS function A has been replaced with the supply voltage $V_{DD}$ in accordance with the identity of FIG. 4a.

FIGS. 12a, 12b and 12c illustrate, respectively, the truth table, Karnaugh plot and logic circuitry of a NOR gate constructed using PASS transistors. In the logic circuit of FIG. 12c the PASS function $\overline{A}$ has been replaced with the reference voltage $V_{SS}$ in accordance with the identity of FIG. 4b.

FIGS. 13a, 13b and 13c illustrate, respectively, the truth table, Karnaugh plot and logic circuit constructed using PASS transistors of an exclusive OR gate.

FIGS. 14a, 14b and 14c illustrate, respectively, the truth table, Karnaugh plot and logic circuit constructed using PASS transistors of an exclusive NOR gate.

Each of the structures shown in FIGS. 9c, 10c, 11c, 12c, 13c and 14c uses only two PASS transistors. Each PASS transistor is controlled either by the A or $\overline{A}$ signal. Each of the logic circuits is capable of producing an appropriate output state in response to any one of the four different possible input states of the two input variables A, B. In FIGS. 9c, 10c, 11c and 12c, none of the PASS variables are related to the CONTROL variables as a result of use of the identities of FIGS. 4a and 4b. The result is an inherent simplicity in each of the circuits.

FIGS. 15a, 15b, 15c and 15d illustrate the implementation of a full adder using the methodology and rules of this invention. The carry associated with the full adder (FIG. 15d) can be implemented using eight (8) PASS transistors as opposed to a much more complex implementation using standard prior art logic components as illustrated, for example, in FIG. 7-3 on page 123 of "Introduction to the Basic Computer" by Donald Eadie, published in 1968 by Prentice-Hall, Inc., Inglewood Cliffs, N.J., which is hereby incorporated by reference. The sum circuit is formed using another eight (8) PASS transistors and is shown in FIG. 16a, 16b and 16c which illustrate the truth table, Karnaugh plot, and PASS transistor implementation, respectively, of a summing network.

FIG. 16d illustrates the layout of the implementation of the circuitry shown in FIG. 16c in terms of PASS transistors. The regularity and orthogonality of the CONTROL functions and PASS functions is readily apparent from this description. The structure is implemented using N channel MOS transistors and the different component layers are indicated as shown by the key associated with the Figure. The polysilicon (denoted as "poly") comprises the gate electrodes of the N channel MOS transistors and the diffusion comprises the source and drain regions of these transistors as well as the conductive interconnects between the source and drain regions of adjacent transistors.

Thus, in FIG. 16d, which shows the carry portion of a full adder 15d, the sum network 16c and a complementary carry portion of a full adder derived from the full adder of 15d, the structure 16d is laid out using N+ diffusions (denoted by the line with an X) polycrystalline silicon (denoted by the straight line) and metal (denoted by the straight line with a cross mark). Deep depletion buried cross unders are denoted as dark rectangles. The buried cross unders serve as conductive paths for current. The MOS transistor is denoted schematically as shown in FIG. 16f wherein the polysilicon gate line is orthogonal to an N+ diffusion line. Underneath the polycrystalline silicon gate in an N+ transistor is a channel region, the conductivity of which is controlled by the signal level on the polycrystalline silicon line. The orthogonality of the layout is apparent from FIG. 16d. FIG. 16d represents one portion of an 8-bit adding circuitry and is designed to mate topologically with adjacent portions of the circuitry as shown in FIG. 16f.

The conventions described above as applicable to FIG. 16d apply equally to FIGS. 8b, 17d, 17h and 19f.

Figure 17B:
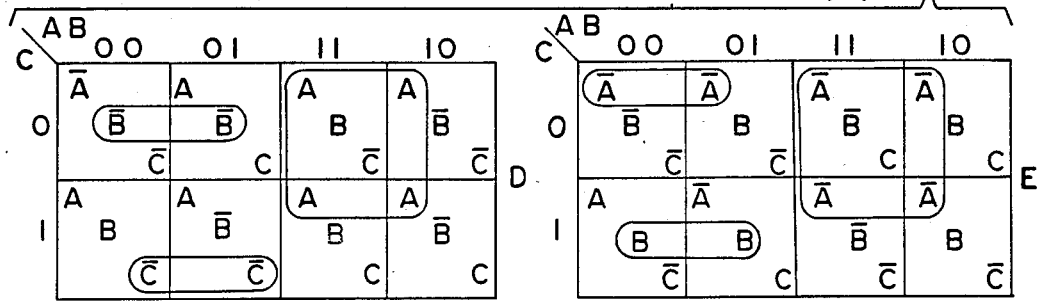

FIGS. 17a and 17b illustrate the truth table and the modified Karnaugh map for a priority encoder. The modified Karnaugh map in FIG. 17b is in two parts. One part illustrates the particular PASS functions which can be used to obtain the output D. However, the mapping illustrates that for the input variables AB having the values 00 or 01 and the input variable C equal to 0, the PASS function is $\overline{B}$ to yield the output function D. For the value of C equal to 1 and the values of AB equal to either 00 or 01, the PASS function necessary to yield the value of D can be either $\overline{C}$ as shown looped, or A. For the values of AB=11 and 10, and either value of C, the PASS function to yield the value of D is A.

Figure 17C:
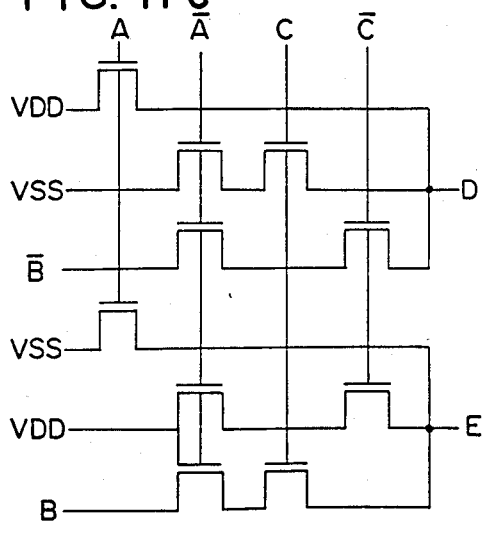
Figure 17D:
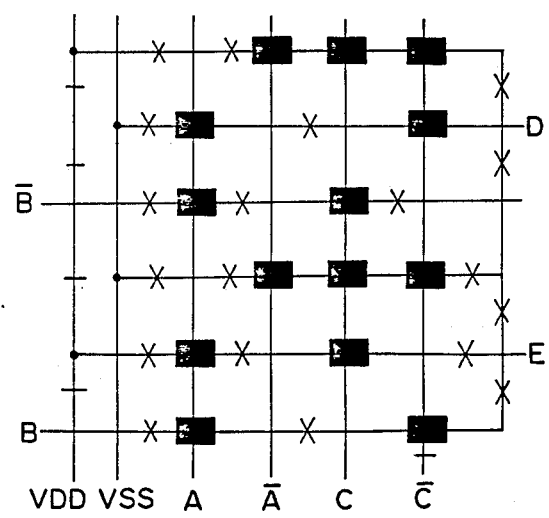

A similar analysis for the output variable E is shown in the second part of the modified Karnaugh map of FIG. 17b. The particular logic shown is implemented in circuit form as shown in FIG. 17c and has a layout as shown in FIG. 17d. The layout of FIG. 17d is keyed identically to that of FIG. 16d. The key to the layout in FIG. 16d applies equally to that in FIG. 17d and to the other drawings such as shown in FIGS. 8b, 17h and 19f in this specification.

The PASS variables can then be transformed as shown in FIG. 17e and 17f to simplify the structure shown in FIG. 17d to form the circuit shown in FIG. 17g. The circuit in FIG. 17g is substantially simpler in terms of topological layout although it contains 16 transistors to the 10 shown in FIG. 17c. The 16 transistors shown in FIG. 17g, however, allow a more rational arrangement of the voltage power lines VDD, VSS and the signal input lines A, $\overline{A}$, B, $\overline{B}$ and C, $\overline{C}$. FIG. 17h illustrates schematically the actual layout of the PASS transistors shown in FIG. 17g. The comparison between FIG. 17c illustrates the type of trade-offs available using the logic system described herein.

FIG. 18a illustrates the schematic block diagram of a binary up/down counter. The truth table for this counter is illustrated in FIG. 18b. Input variables D, $T_{i-1}$ and $Q_i$ control the state of the output variables $D_i$ and $T_i$. The modified Karnaugh map for output variable $D_i$ is shown in FIG. 18c and for output variable $T_i$ is shown in FIG. 18d. The particular variables looped to provide the PASS function for generating the output variable $D_i$ are shown to be the variable T for $Q_i=0$ and all values of the variables D and $T_{i-1}$, and the variable $\overline{T}$ for $Q_i=1$ and all values of D and $T_{i-1}$. The output variable $T_i$ is generated by the looped PASS functions as illustrated in FIG. 18d. The structure to implement the truth table is as shown in FIG. 18e. Note that for all values of the variables D and $T_{i-1}$ and for $Q_i=0$, the output function $D_i$ is generated by passing the T input signal with the $\overline{Q}$ control signal. The output variable $D_i$ for $Q=1$ and all values of D and $T_{i-1}$ is generated by passing the input signal $\overline{T}$ with the Q gate control signal. This structure is shown as implemented in the top two lines of the circuit of FIG. 18e. The $T_i$ output variable is generated by four paths of functions reflecting the four different possible sets of CONTROL functions and PASS functions necessary to generate all possible combinations of $T_i$ output signals. For values of $DT_{i-1}$ equals 11 or 10 and $Q_i$ equal 0, the $T_{i-1}$ input signal is passed by the transistors 184 and 185 controlled by the $\overline{Q}_i$ CONTROL signal and the D CONTROL signal, respectively, and for $DT_{i-1}$ equals 00 or 01 and $Q_i$ equals 1, by transistors 182 and 183 controlled by the $Q_i$ input signal and the $\overline{D}$ input signal, respectively. The $Q_i$ input signal is also passed by transistors 186 and 187 controlled by the $\overline{Q}$ and the $\overline{D}$ signals, respectively, when Q=0 or VSS, and the $\overline{Q}$ input signal (which is equivalent to VSS by the transformation of FIG. 4b) is passed by transistors 188 and 189 controlled by the gates driven by $Q_i$ and D when $Q_i=1$ or $\overline{Q}_i=$VSS.

Figure 19A:
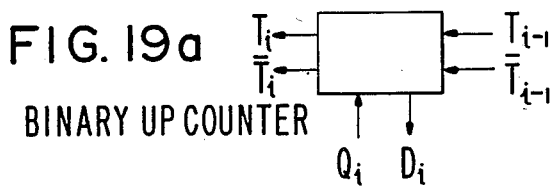
FIG. 19a illustrates in schematic block form a binary up counter.

FIG. 19a illustrates in schematic block diagram form the input and output signals to and from a binary up counter.

FIG. 19b gives the truth table for the input variables $T_{i-1}$ and $Q_i$ and their relationship to the output variables $D_i$ and $T_i$. FIGS. 19c and 19d give the modified Karnaugh plots for the output variables $D_i$ and $T_i$, respectively, as a function of the input variables $T_{i-1}$ and $Q_i$.

FIG. 19e illustrates the circuit implementation of the logic using the PASS transistors of this invention derived using the input variables $T_{i-1}$ and $Q_i$ wherein $Q_i$ as shown in Karnaugh plot 19d has only the value VSS per the equivalent circuit of FIG. 4b.

FIG. 19f illustrates the layout schematically of the circuit shown in FIG. 19e.

FIG. 20a gives the truth table for a JK flip-flop with inputs JK and Q and output D.

FIG. 20b shows the modified Karnaugh map for the truth table of FIG. 20a.

FIG. 20c shows the circuit implementation of the flip-flop using the PASS functions of this invention. Note that the circuit implementation requires only two PASS transistors reflecting only two looped PASS functions in the modified Karnaugh plot of FIG. 20b.

FIG. 20d shows schematically the extremely simple implementation of this structure using again the key shown in FIG. 16d.

FIG. 21a illustrates a schematic block diagram of a shift left/hold circuit and the input and output variables to this circuit. The input variable C, $Q_{i-1}$ and $Q_i$ produce an output variable $D_i$. The modified Karnaugh plot for this circuit is illustrated in FIG. 21c and is implemented as shown in FIG. 21d by a two-transistor circuit. The schematic layout of this two-transistor circuit is illustrated in FIG. 21e.

The structures of this invention are, as seen from the last two implementations in particular, extremely simple compared to prior art logic implementations. Thus, the topological advantages of this invention are achieved together with significant reductions in the complexity of components. Structures made in accordance with this invention have increased packing density in terms of logic function per unit area and thus possess either smaller size with commensurate increased yield or a substantially larger number of devices formed on a chip of silicon material. Naturally, the devices described above are to be implemented in standard semiconductor processing technology such as N channel MOS technology. The invention however, is capable of being implemented in other semiconductor technologies including P channel MOS technology and CMOS technologies.

While several embodiments of this invention have been described above, other embodiments of this invention will be obvious in view of the above description to those skilled in the logic design arts. The above description is therefore intended to be illustrative only and not limiting.

What is claimed is:

1. A logic circuit including as its basic element PASS transistors wherein each PASS transistor comprises an input lead, an output lead and a control lead for controlling the transmission of signals from said input lead to said output lead, said logic circuit comprising:
  an output node; and
  a plurality of PASS transistors connected to receive a first input function, a second input function and a third input function supplied to said input leads and to receive a plurality of selected control signals applied to said control leads of said PASS transistors;
  where said first, second and third input functions are a reference voltage VSS, a supply voltage VDD and a carry variable $C_{i+1}$, said carry variable $C_{i+1}$ input function being supplied to said input leads of two of said PASS transistors, said VSS and said VDD input functions being separately supplied to said input leads of two other of said PASS transistors, and said selected control signals are input variables to be added, $A_i$, $B_i$, said selected control signals, along with their complements $\overline{A}_i$ and $\overline{B}_i$, being supplied to said control leads of said transistors, said input functions and said selected control signals being selectively combined in said PASS transistors, to produce a full adder carry out function at said output node.

2. A logic circuit in accordance with claim 1 in which the carry output therefrom, $C_i$, is supplied in the form of $C_{i+1}$ and $\overline{C}_{i+1}$ as input functions in the PASS logic circuitry to produce an output $S_i$ representing the sum of the full carry adder.

3. A logic circuit including as its basic element PASS transistors wherein each PASS transistor comprises an input lead, an output lead and a control lead for controlling the transmission of signals from said input lead to said output lead, said logic circuit comprising:
  a pair of output nodes; and
  a plurality of PASS transistors connected to receive a plurality of input functions supplied to said input leads and to receive a plurality of selected control signals applied to said control leads of said plurality of PASS transistors;
  in which said input functions are a supply voltage VDD, a reference voltage VSS, input variables A, B, C and their complements $\overline{A}$, $\overline{B}$, $\overline{C}$, said VSS input function being supplied as an input to said input leads of two of said PASS transistors, said VDD input function being supplied as an input to said input leads of two other of said PASS transistors, said B and said $\overline{B}$ functions being supplied separately to said input leads of two further of said PASS transistors, said input variables A, $\overline{A}$, C, $\overline{C}$ being supplied to said control leads of said plurality of PASS transistors, said input functions and said selected control signals being selectively combined in said PASS transistors to produce a priority encoder logic circuit output function on said pair of output nodes;
  said priority encoder having two outputs D and E, said outputs D and E having the following relationship to said input variables A, B and C:

| | |
|---|---|
| if A=1 | DE=10 |
| if A=0, B=1 | DE=01 |
| if A=0, B=0, C=1 | DE=00 |
| if A=0, B=0, C=0 | DE=11 |

4. A logic circuit including as its basic element PASS transistors wherein each PASS transistor comprises an input lead, an output lead and a control lead for controlling the transmission of signals from said input lead to said output lead, said logic circuit comprising:
  a pair of output nodes; and
  a plurality of PASS transistors connected to receive a plurality of first variable functions supplied to said input leads and to receive a plurality of selected control signals applied to said control leads of said PASS transistors,
  in which said input functions are $T_{i-1}$, $\overline{T}_{i-1}$ and a reference voltage VSS, and said control signals are $Q_i$, $\overline{Q}_i$, D and $\overline{D}$, said input functions and said selected control signals being selectively combined in said PASS transistors to produce a binary up-/down counter logic device output at said pair of output nodes, said binary up/down counter having two outputs $D_i$ and $T_i$, said outputs $D_i$ and $T_i$ having the following relationship to said input variables D, $T_{i-1}$ $Q_i$,

| D | $T_{i-1}$ | $Q_i$ | $D_i$ | $T_i$ |
|---|---|---|---|---|
| 0 | 0 | 0 | 0 | 0 |
| 0 | 0 | 1 | 1 | 0 |
| 0 | 1 | 0 | 1 | 0 |
| 0 | 1 | 1 | 0 | 1 |
| 1 | 0 | 0 | 0 | 0 |
| 1 | 0 | 1 | 1 | 0 |
| 1 | 1 | 0 | 1 | 1 |

5. A logic circuit including as its basic element PASS transistors, wherein each PASS transistor comprises an input lead, an output lead and a control lead for controlling the passing of signals from said input lead to said output lead, said logic circuit comprising:
   an output node; and
   at least two PASS transistors;
   means for supplying a first input function to said input lead of one of said transistors, said input function being $Q_i$;
   means for supplying a second input function to said input lead of another of said transistors, said second input function being $Q_{i-1}$; and
   means for supplying selected control signals to said control leads of said transistors, said selected control signals being C, and $\overline{C}$;
   said input function and said selected control signals being selectively combined in said PASS transistors to generate on said output mode a logic function $D_i$ representing a shift left/hold function;
   said output function $D_i$ having the following relationship to said variables C, $Q_{i-1}$, $Q_i$

| C | $Q_{i-1}$ | $Q_i$ | $D_i$ |
|---|---|---|---|
| 0 | 0 | 0 | 0 |
| 0 | 0 | 1 | 1 |
| 0 | 1 | 0 | 0 |
| 0 | 1 | 1 | 1 |
| 1 | 0 | 0 | 0 |
| 1 | 0 | 1 | 0 |
| 1 | 1 | 0 | 1 |
| 1 | 1 | 1 | 1 |

\* \* \* \* \*